United States Patent [19]

Clemens et al.

[11] 4,291,322
[45] Sep. 22, 1981

[54] STRUCTURE FOR SHALLOW JUNCTION MOS CIRCUITS

[75] Inventors: James T. Clemens, Allentown; Kay M. Locke, Northampton, both of Pa.

[73] Assignee: Bell Telephone Laboratories, Incorporated, Murray Hill, N.J.

[21] Appl. No.: 61,664

[22] Filed: Jul. 30, 1979

[51] Int. Cl.³ .................... H01L 29/78; H01L 29/04; H01L 23/48
[52] U.S. Cl. .................................. 357/23; 357/59; 357/65; 357/68; 357/71
[58] Field of Search .................. 357/59, 65, 71, 68, 357/23

[56] References Cited

U.S. PATENT DOCUMENTS

| | | | |
|---|---|---|---|
| 3,456,335 | 7/1969 | Hennings | 357/65 |
| 3,462,650 | 8/1969 | Hennings | 357/59 |
| 3,571,914 | 3/1971 | Lands | 357/68 |
| 3,609,470 | 9/1971 | Kuiper | 357/67 |
| 3,652,907 | 3/1972 | Page et al. | 357/59 |
| 3,667,008 | 5/1972 | Katnack | 357/59 |
| 3,740,835 | 6/1973 | Duncan | 357/71 |
| 3,833,919 | 9/1974 | Naber | 357/71 |
| 3,902,188 | 8/1975 | Jacobson | 357/59 |
| 4,042,953 | 8/1977 | Hall | 357/71 |
| 4,124,934 | 11/1978 | Debrebisson | 357/59 |
| 4,134,125 | 1/1979 | Adams et al. | 357/59 |
| 4,136,434 | 1/1979 | Thibault et al. | 357/59 |
| 4,141,023 | 2/1979 | Yamada | 357/59 |
| 4,146,902 | 3/1979 | Tanimoto et al. | 357/6 |
| 4,207,586 | 6/1980 | Lebailly | 357/59 |
| 4,220,961 | 9/1980 | Werner | 357/46 |

Primary Examiner—Andrew J. James
Attorney, Agent, or Firm—Lester H. Birnbaum

[57] ABSTRACT

A contact structure and method of fabrication for achieving shallow junction MOS integrated circuits. An insulator (23) such as phosphosilicate glass is deposited over the circuit and contact windows (24 and 25) opened therein. Fire polishing of the glass is eliminated so that the junctions can be made shallow and the sides of the windows remain steep. A layer of polycrystalline silicon (26) is deposited over the insulator and the contact windows so as to conformally coat the sides of the windows and the exposed semiconductor. A contact metal (28 and 29), such as aluminum, is deposited over the polycrystalline silicon. The metal tends to be essentially discontinuous over the steep sides of the windows, but the polycrystalline silicon layer has sufficiently low resistivity to provide adequate conduction in these areas.

10 Claims, 7 Drawing Figures

STRUCTURE FOR SHALLOW JUNCTION MOS CIRCUITS

BACKGROUND OF THE INVENTION

This invention relates to MOS integrated circuits, and in particular to a contact structure which permits fabrication of such circuits with shallow junctions.

In the present development of MOS integrated circuits, a primary objective is to produce junctions as shallow as possible which permits fast operation and little side wall capacitance. Shallow junctions, however, result in contacting difficulties. In particular, when aluminum is utilized to contact the surface region, the sintering step causes aluminum to alloy with the semiconductor at a depth past the junction resulting in spikes which can short the junction. Several solutions have been suggested to eliminate this spiking problem. A typical approach when fabricating circuits with As-doped surface regions, is to diffuse phosphorous in an area of the exposed surface region to a depth below the surface region. Thus, during a later sintering step, the aluminum will not penetrate through the deeper phosphorous diffusion. Further, use of an aluminum-silicon alloy in place of pure aluminum as the contact metal will reduce the depth of alloying and prevent spiking, either alone or in combination with the phosphorous diffusion step. (See, e.g., U.S. Pat. No. 3,609,470 issued to Kuiper.) It has also been recognized that spiking can be prevented by depositing a thin layer of silicon over the contact windows followed by the aluminum deposition. (See, e.g., U.S. Pat. No. 3,740,835, issued to Duncan.) In such cases, the deposited layer of silicon, rather than the underlying semiconductor body, will act as a source for diffusion of Si into the Al layer.

A further problem in achieving shallow junctions involves necessary heat treatments in formation of contact windows. In a typical process, subsequent to formation of the surface regions, a phosphosilicate glass is deposited over the semiconductor body and contact windows defined therein by photolithography. The resulting side walls are steep with sharp edges and do not permit complete coverage by the contact metal. The glass is therefore fire polished by heating at a temperature sufficient to soften the glass and slope the side walls of the windows. This typically requires a temperature of approximately 1000° C. to 1100° C. for 15 minutes, which causes a diffusion of the surface region impurities further into the semiconductor body increasing the junction depth.

In general, it is desirable to reduce the extent of heating during the processing of MOS integrated circuits so that the junctions can be kept as shallow as possible. It is, therefore, a primary object of the invention to provide a contact structure and method of fabricating such structure which reduces the number of heating steps and still provides reliable ohmic contact to the devices in the circuit.

SUMMARY OF THE INVENTION

These and other objects are achieved in accordance with the invention. In accordance with one aspect, the invention is an MOS integrated circuit including a structure for making electrical contact to portions of the circuit where the structure comprises an insulator such as a phosphosilicate glass layer formed over the semiconductor and including windows formed therein exposing the portions to be contacted, a layer of polycrystalline silicon formed selectively over the insulating layer so as to form a continuous coating over the side walls of the windows and the exposed portions of the circuit and a layer of metal formed over the polycrystalline silicon layer. The side walls of the windows are formed essentially vertically with sharp edges because of the absence of any fire polishing steps. The layer of metal tends to be discontinuous at the side walls because of their vertical nature but the resistance of the polycrystalline silicon layer is sufficiently low to provide current conduction in the areas of the side walls.

BRIEF DESCRIPTION OF THE DRAWING

These and other features of the invention are delineated in detail in the following description. In the drawing.

It will be appreciated that for purposes of illustration these figures are not necessarily drawn to scale.

DETAILED DESCRIPTION

The invention will be described with reference to the fabrication of a portion of an MOS random access memory circuit illustrated in FIGS. 1–6. It will be understood that the figures show only part of an integrated circuit including many more devices. Although in this particular example the invention was utilized to fabricate 16k Random Access Memory circuits, it will be appreciated that the invention may be used with any MOS integrated circuit where shallow junctions are desired.

Figure 1:
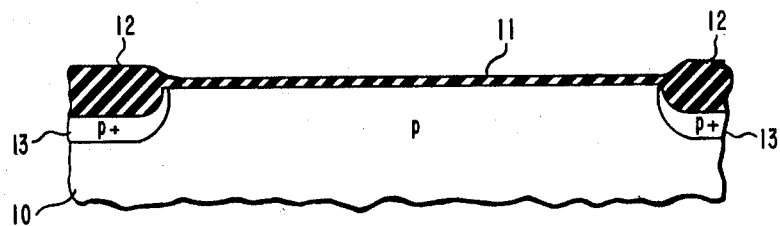
FIGS. 1–7 are cross-sectional views of a portion of an integrated circuit during various stages of fabrication in process with one embodiment of the invention.

As shown in FIG. 1, on a major surface of a p-type silicon semiconductor body, 10, was formed a first thin gate oxide, 11, which was bounded by a field oxide 12. The field oxide, 12, was formed by using standard local oxidation techniques, i.e., by utilizing a silicon nitride mask and then growing silicon dioxide by thermal oxidation to a thickness of approximately 1.2 microns. After removing the silicon nitride, the gate oxide, 11, was then formed by standard thermal oxidation techniques to a thickness of approximately 700 Angstroms. P+ channel stop regions, 13, used for electrical isolation, were formed by ion implantation of Boron prior to the field oxidation.

Figure 2:
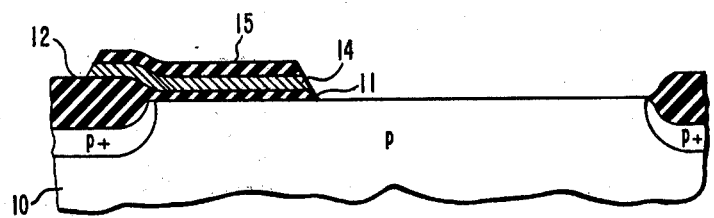

As shown in FIG. 2, a first electrode, 14, comprising a layer of polycrystalline silicon was formed selectively over a portion of the field oxide, 12, and the first gate oxide, 11. The layer was formed by standard chemical vapor deposition techniques utilizing $SiH_4$ and a carrier gas of $N_2$ so as to produce a polycrystalline silicon layer approximately 0.5 $\mu$m thick. The layer was made conducting by diffusion of phosphorous therein according to standard techniques. Formed on the first electrode 14 was a layer, 15, comprising silicon dioxide which was approximately 0.3 $\mu$m thick in order to electrically insulate the first electrode from the subsequently deposited second polycrystalline silicon electrode. This layer was also formed by a standard oxidation technique utilizing water vapor. Note also that the portions of the first gate oxide layer, 11, not covered by the first polycrystalline silicon electrode, 14, were etched off.

Figure 3:
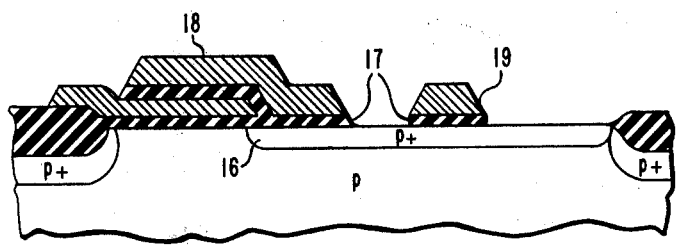

As shown in FIG. 3, a p+ type surface region, 16, was formed in the area of the semiconductor body not covered by the first polysilicon electrode 14 or the field oxide 12. The region was formed by ion implantation of Boron with a sufficient dose to produce the proper electrical properties in the gate region of the field effect transistor to be fabricated. Typically, the region has an impurity concentration of approximately $5 \times 10^{15}$ per cm$^3$ and is formed to a depth of approximately 0.5 µm. (The impurity concentration of the body 10 was approximately $2 \times 10^{15}$ per cm$^3$.) A second gate oxide layer, 17, was formed in the exposed surface of the semiconductor to a thickness of approximately 0.080 µm, followed by deposition of a second polycrystalline silicon layer over the second gate oxide and the layer, 15. The layer was formed by standard chemical vapor deposition in the same manner as electrode 14. The layer was then etched to form second polycrystalline silicon electrode 18 and gate electrode 19. The exposed areas of the second gate oxide layer 17, as well as the exposed portions of insulator 15, were also etched off to give the structure shown in FIG. 3.

Figure 4:
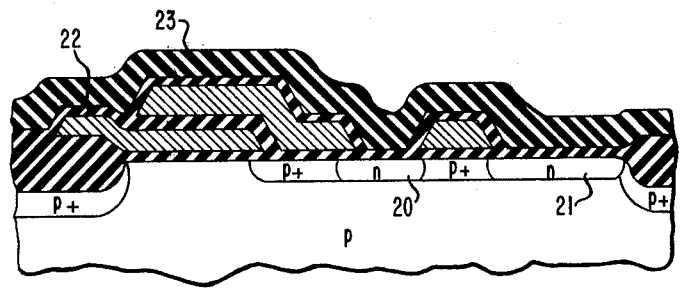

Next, as shown in FIG. 4, localized surface regions 20 and 21 of n conductivity type which constitute the source and drain regions, respectively, of the transistor were formed in the areas of the semiconductor not covered by the polycrystalline silicon electrodes. The regions were formed by ion implantation of arsenic utilizing an ion beam with an energy of 30 Kev and a dose of $1.0 \times 10^{16}$ atoms/cm$^2$. The impurities were initially implanted to a depth of approximately 0.020 µm and then driven further into the semiconductor by the subsequent thermal processing steps needed to finish the device fabrication. The depth of these regions after the subsequent heat treatments was approximately 0.35 µm, and the doping concentration was approximately $2.5 \times 10^{20}$ atoms/cm$^2$. A heat treatment of 900° C. for one hour was used to anneal the area of the semiconductor damaged by the implantation, and a 950° C. heat treatment for 50 minutes was used to oxidize the exposed surface of the semiconductor and polycrystalline silicon electrodes forming the layer, 22. It will be realized that standard diffusion techniques can also be used to form the source and drain.

It is an objective of the invention to keep the junction depth essentially constant through the subsequent contacting steps, preferably to a depth of approximately 0.4µ or less. This is a factor of two smaller than the standard prior art MOS junction depths of approximately 0.85µ. In order to achieve this shallow junction depth, any further heating steps should be at temperatures and times insufficient to cause any further significant diffusion of the source and drain impurities (i.e., further diffusion typically less than 0.05µ). This typically means avoiding temperatures in excess of 1,000° C. for any appreciable time.

An insulating layer 23 was then formed over the structure. In this example, the insulator was a phosphosilicate glass. In particular, it has been found preferable for good step coverage and moderate temperature deposition to deposit a phosphorous-doped glass by chemical vapor deposition from a source comprising tetraethylorthosilicate and triehyl phosphite (the resulting glass hereinafter referred to as PTEOS glass). In a particular embodiment, the semiconductor structure was placed in a hot walled horizontal tube furnace reactor, and separated therefrom were separate sources of liquid tetraethylorthosilicate and triethyl phosphite. The semiconductor was heated to a temperature of approximately 765° C. and a gas of nitrogen was introduced into the source vessels. The flow rate in the tetraethylorthosilicate source was fixed at 2.4 LPM and the flow rate in the triethyl phosphite source was adjusted to achieve the desired phosphorous concentration. The resulting vapors were mixed with a carrier gas of nitrogen which was preheated to a temperature of 900° C. and has a flow rate of 300 LPM. The vapors were then passed over the seminconductor structure and the phosphorous-doped glass layer was deposited thereon at a rate of approximately 100 Angstroms per minute as a result of the decomposition of the two source materials. When the flow rate of nitrogen in the triethyl phosphite source was 1.6 LPM, the phosphorous concentration in the resulting glass was approximately 6.5 weight percent. In general, a phosphorous concentration of 2–8 weight percent is desirable. The layer was deposited to a thickness of approximately 1 µm. Preferably, the thickness of the layer should be in the range 0.50 micron to 2.0 micron. It will be appreciated that parameters given above for the deposition of PTEOS glass can be varied according to particular needs. (See, for example, U.S. Pat. No. 3,571,914 issued to Lands et al.) For example, the deposition temperature can be in the range 700°–900° C.

Following deposition, the PTEOS layer was annealed by heating in a steam ambient at a temperature of approximately 950° C. for 30 minutes. This step aids in the adhesion of photoresist material and reduces possible positive charge build-up in the insulating layers. This step can, in general, be carried out at a temperature of 750° C. to 1000° C. for 20–40 minutes.

One of the advantages of using a PTEOS layer is the fact that surface step coverage is much improved when compared to that obtained from the standard phosphosilicate layer which is formed by decomposition of SiH$_4$ and PH$_3$ with a carrier gas of oxygen and the semiconductor heated to 450° C. An additional advantage is the fact that annealing can be carried out at a temperature approximately 100° C. lower than that required for the standard phosphosilicate layer and thus a shallower junction depth can be realized. However, it should be clear that other suitable phosphosilicate glass layers formed by other methods can be employed with the present invention. Other types of standard insulators, such as SiO$_2$ and Si$_3$N$_4$ may also be utilized.

Figure 5:
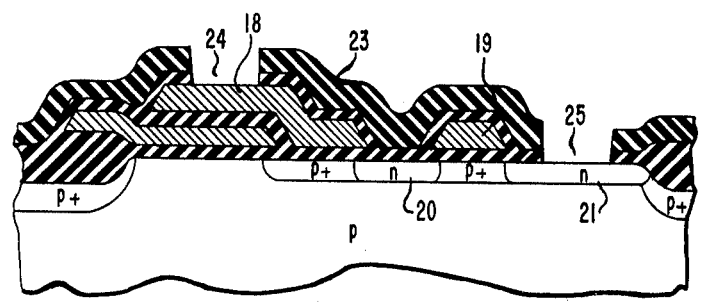

In the next step, as shown in FIG. 5, cylindrical contact windows, 24 and 25, were opened in the glass layer to expose a portion of the second polycrystalline silicon electrode, 18, and drain region, 21, respectively. This was accomplished by standard photolithographic techniques employing a photoresist mask (not shown) and a plasma etching employing a gas mixture of 55 percent C$_2$F$_6$ and 45 percent CHF$_3$. (For a more detailed discussion of such plasma etching, see U.S. Patent Application of C. J. Mogab, Ser. No. 929,568, filed July 31, 1978, which is incorporated by reference herein.) Other suitable plasma etchants may be employed. It will be noted that the side walls of the windows are essentially vertical (i.e., have an angle of at least 75° with the horizontal surface) and have sharp edges. This is desirable to keep the cell size as small as possible. In standard circuit fabrication, the side walls would be tapered and the sharp edges rounded by fire polishing the glass layer, typically at a temperature of approximately 1000° C. to 1100° C. for 15 minutes, to permit complete coverage by the subsequently formed contact layers. (See, for example, U.S. Pat. No. 3,833,919 issued to Naber.) This step would cause further diffusion of the surface regions and thereby increase the junction depth.

In accordance with one feature of the invention, the fire polishing step is eliminated and the side walls remain vertical with sharp edges. Nevertheless, reliable contact to the exposed seminconductor is achieved in accordance with the subsequent steps.

The structure was then subject to a predeposition treatment which involved passing vapors of HCl and $N_2$ over the structure in a reaction chamber at a temperature of 600°–615° C. and pressure of approximately 0.4 Torr. The flow rate of the $N_2$ vapor was approximately 300 ml/min and that of the HCl was 400–500 ml/min. The structure was subject to this treatment for approximately 3 minutes in order to clean the surfaces of the structure for the subsequent deposition step.

Figure 6:
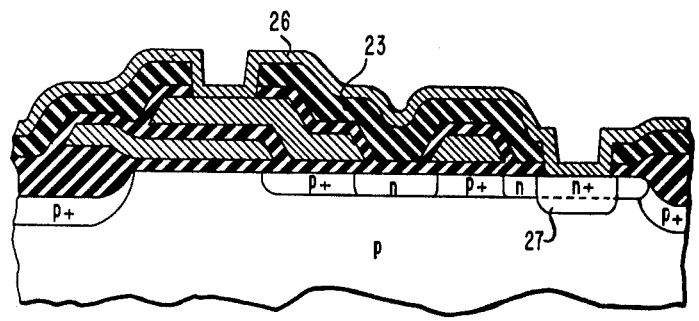

Next, as shown in FIG. 6, a polycrystalline silicon layer 26 was deposited on the PTEOS glass layer so as to conformally coat the side walls of the contact windows, the exposed portions of the previously deposited polycrystalline electrodes, and the exposed portions of the semiconductor body. This was accomplished by utilizing a low pressure chemical vapor deposition as in the previously deposited polycrystalline silicon layer. In this particular example, the structure was placed in a reaction chamber with a pressure of approximately 0.40 Torr and was heated to approximately 600° C. Vapors of $N_2$ and $SiH_4$ were mixed and caused to flow over the structure. The flow rate of $N_2$ was approximately 300 ml/min and that of the $SiH_4$ was approximately 200 ml/min. In general, a recommended flow rate of $N_2$ is 0–1000 ml/min and a recommended rate for $SiH_4$ is 100–300 ml/min. The decomposition of the $SiH_4$ vapor results in deposition of the polycrystalline silicon layer 26 at a rate of approximately 80 Angstroms per minute. The process was continued until a layer approximately 3,000 Angstroms thick was deposited.

It is important to choose a sufficiently high temperature to insure that the polycrystalline silicon layer conformally coats the steep side walls and sharp edges of the contact windows. It appears that a temperature range of approximately 500°–900° C. will achieve this result. Further, the thickness of the layer is a significant factor since the polycrystalline silicon layer may be required to perform the current carrying function in the areas of the side walls. The layer should not be too thin, otherwise an unacceptably large resistance will be added to the contacts. The upper limit on thickness is established by the size of the contact window, i.e., if the layer is too thick it will completely fill the contact window and create a planar surface. A preferred thickness range for the polycrystalline silicon layer is therefore 0.10 μm–1.0 μm.

The deposited layer of polycrystalline silicon in this example is not conducting. The layer was made conducting in the following step wherein the structure was placed in a diffusion furnace in the presence of phosphorous impurities. The impurities were diffused into and through the polycrystalline silicon layer, 26 at a temperature for approximately 950° C. for 30 minutes. This step dopes the polycrystalline silicon layer at a concentration of approximately $10^{21}$ atoms/cm$^3$. The step also forms a phosphorous-doped surface region 27 to a depth of approximately 1 μm in the area of the semiconductor beneath window 25. This region is merely a consequence of the diffusion step and is not needed since the polycrystalline silicon layer will provide sufficient silicon to the subsequently-formed contact metal during sintering to avoid spiking. However, the presence of the region 27 in no way affects the operation of the shallow junction between the drain region 21 and the surrounding semiconductor and so its presence involves no detriment. The polycrystalline silicon layer, 26, can be deposited initially as a conducting layer by incorporating a source of impurities such as phosphorous in the vapors of the deposition step according to known techniques. In any event, the phosphorous diffusion step is still desirable since it also forms a region of phosphorous (not shown) at the opposite major surface of the semiconductor to getter any impurities in the semiconductor.

One of the advantages of the present invention is the fact that the phosphorous diffusion step was performed at a temperature approximatey 100° C. less than that required when the polycrystalline silicon layer 26 is absent and pure aluminum is used as the contact layer. This results in less diffusion of the already formed source and drain regions to minimize increases in the junction depths in accordance with a major objective of the invention. In general, the diffusion step may be carried out at a temperature of 800°–1000° C. for a time of 20–40 min.

It will be realized that the resistivity of the polycrystalline silicon layer should be kept sufficiently low to perform the current carrying function. In this example, the resistivity of the layer was 30Ω/. For proper contacts in accordance with the invention, the final resistivity of the layer is preferably kept below 50Ω/. While the polycrystalline silicon layer in this example was deposited by a low pressure chemical vapor deposition using particular materials, it should be apparent that other materials may be substituted for those described and other standard methods may be used as long as the resulting layer has the desired characteristics previously described. For example, sputtering and plasma deposition techniques may be used provided the structure is heated to a sufficient temperature to insure conformal coating.

Figure 7:
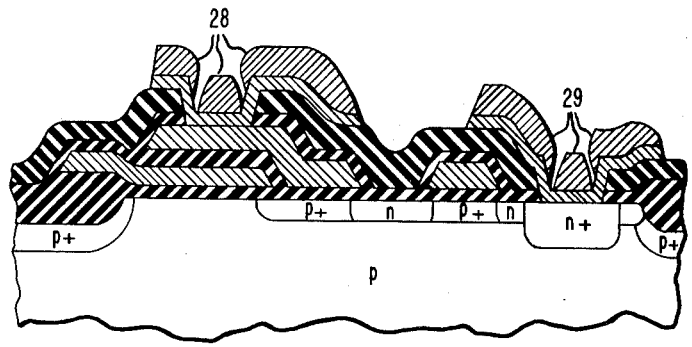

Following a standard annealing of the structure by heating in a hydrogen ambient at a temperature of 500° C., the contact metal was formed as shown in FIG. 7. The individual contacts, 28 and 29, were formed in this example by electron-gun evaporation of a layer of aluminum over essentially the entire surface of the polycrystalline silicon layer 26 and defining the contacts by standard photolithography. One of the advantages of utilizing the polycrystalline silicon layer, 26, is the fact that pure aluminum rather than an aluminum-silicon alloy can be used readily, since the polycrystalline layer will provide a source for diffusion of silicon into the aluminum during the later sintering step to prevent spiking. A pure aluminum layer is much easier to deposit and permits a high throughput in the circuit fabrication.

In the particular process used, the structure was placed in a standard deposition chamber and the pressure pumped down to approximatey $10^{-7}$ Torr. While the aluminum source evaporated due to the impinging electron beam, the structure was heated to a temperature of 300° C. A useful temperature range appears to be 25°–350° C. The aluminum layer was deposited to a thickness of approximately 1 μm, but thicknesses of 0.10 μm–2.0 μm would be appropriate. The aluminum layer was defined by means of a photoresist mask (not shown) and a plasma etch utilizing $CCL_4$ at a flow rate of 350 cm$^3$/min which was mixed with a combination of 92 percent Argon and 8 percent Hydrogen, the flow rate of the latter combination being 20 cm$^3$/min. The etchant also removes the underlying polycrystalline silicon in the area not covered by the mask to give the structure shown in FIG. 7.

After the aluminum and polycrystalline silicon layers were etched to form the appropriate interconnect pattern, the structure was annealed by heating in a hydroge atmosphere at a temperature of approximately 450° C. for 30 min. in accordance with standard techniques to attain the desired properties. This step sinters the aluminum and also determines the electrical characteristics of the $SiO_2$-Si interface. In general, a sintering at 350°–500° C. for 15–45 min. is useful.

It will be noted that due to the steepness of the side walls of the contact windows, the aluminum layer tends to not coat these areas.

It is characteristic of our process that it is not essential that the side walls be coated continuously to achieve a desirably low contact resistance and that accordingly steep side walls may be used with a consequent space saving. In the circuits actually produced, SEM photographs showed that there was a definite break in the aluminum metallization in the area of the side walls due to the steepness of the side walls. In such cases, the polycrystalline silicon layer will carry the current in the area of the side walls. In some instances, such as when there is a slight taper in the side walls, some metallic coating of the side walls may occur but with a significant thinning of the metal layer in these areas. In such cases, it will be desirable to include the polycrystalline silicon layer in accordance with the invention to avoid complete dependence on the metallic coating for achieving the desired contact resistance. In cases where the deposited metal thickness in the area of the side walls is less than one half of the deposited thickness elsewhere on the contact area, the metal has a tendency to break during subsequent handling and circuit operation, and the polycrystalline layer should insure an adequate contact in such cases. In order to define the invention in the appended claims, the term "essentially discontinuous" is used to indicate the general situation where the metal contact layer in the area of the side walls is $0-\frac{1}{2}$ of the deposited thickness elsewhere on the contact area. The term "discontinuous" is used to indicate the case where there is a complete break in the contact layer in the area of the side walls, i.e., the thickness in these areas is essentially zero so that current is being conducted by the polycrystalline silicon layer. If the polycrystalline silicon layer carries the current in the area of the side walls, this will cause some added resistance in the contact scheme. However, it has been found that this added resistance can be tolerated in MOS circuits, which typically operate at high voltage and low current. To illustrate, the diameter of the contact windows was approximately 3 $\mu$m and the thickness of the PTEOS glass layer was 1.0 $\mu$m. This means that each contact window constitutes approximately 1/9. In a worst case situation, the resistivity of the polycrystalline silicon is 50$\Omega$/. This means that the additional contact window resistance is approximately 5–6$\Omega$. This added value is less than $\frac{1}{2}$ of the source-/drain sheet resistance and should not significantly affect the operation of the circuit.

This was confirmed in the fabrication of 16k Random Access Memory Circuits as described above. The circuit had junction depths of approximately 0.35 $\mu$m which is less than $\frac{1}{2}$ of that of standard circuits. The gate oxide was 680 Angstroms, the source/drain sheet resistance was 21$\Omega$/ (at 27° C.) and the threshold voltage was 1.1 volts (at $V_{BB} = -5.0$ volts). This illustrated that the proper threshold voltage was achieved in spite of the significantly shallower junctions. Probe tests showed yields comparable to prior art circuits.

Although the invention has been described primarily in relation to the use of a phosphosilicate glass and the desire to eliminate the reflow firing step, it should be realized that the invention could be used with other insulators wherever a contact window with steep side walls is formed. For example, if a standard $SiO_2$ or $Si_3N_4$ layer is used and the contact windows are formed by plasma etching, a nearly vertical side wall will usually be produced and the contacting scheme in accordance with the invention can be used advantageously. In addition, although not shown in the figures, the contact structure can be used to contact the gate electrodes of the transistors whether the electrodes are formed from polycrystalline silicon as described or from other materials such as refractory metals or metal silicide. Furthermore, although the invention has been described with regard to plasma etching of contact windows, it is equally applicable where the windows are opened by other etching techniques, such as wet chemical etching, and steep side walls are produced (i.e., the angle at the base of the layer is at least 50 degrees relative to the horizontal surface). Finally, it will be realized that there may be some cases where the side walls will form an angle of greater than 90° C. with the horizontal surface. The invention may also be used advantageously to form contacts in such windows.

Various additional modifications will become apparent to those skilled in the art. All such variations which basically rely on the teachings through which the invention has advanced the art are properly considered within the spirit and scope of the invention.

We claim:

1. An MOS integrated circuit including source and drain regions (20 and 21) of one conductivity type formed in one major surface of a semiconductor body (10) of opposite conductivity type so as to form p-n junctions therein and a structure for making electrical contact to portions of the circuit comprising an insulating layer (23) formed over the circuit and including windows (24 and 25) formed therein exposing the portions to be contacted, a layer (26) of polycrystalline silicon selectively formed over said insulating layer so as to form a continuous coating over the side walls of said windows, and a layer of metal (28 and 29) formed over said polycrystalline silicon layer CHARACTERIZED IN THAT the junction depths of the source and drain regions are 0.40 $\mu$m or less, the side walls of the windows are steep with sharp edges, the layer of metal is essentially discontinuous at the side walls, and the polycrystalline silicon layer provides a low resistance to current conduction in the areas of the side walls.

2. The circuit according to claim 1 wherein the metal layer comprises aluminum.

3. The circuit according to claim 1 wherein the metal layer has a thickness of 0.10–2.0 $\mu$m over the portions of the polycrystalline silicon layer outside the areas of the side walls and a thickness of $0-\frac{1}{2}$ of said thickness over the areas of the side walls.

4. The circuit according to claim 1 wherein the resistivity of the polycrystalline silicon layer is 50$\Omega$/ or less.

5. The circuit according to claim 1 wherein the thickness of the polycrystalline silicon layer is within the range of 0.10 $\mu$m–1.0 $\mu$m.

6. The circuit according to claim 1 wherein the insulator comprises a phosphosilicate glass.

7. An MOS integrated circuit including source and drain regions (20 and 21) of one conductivity type formed in one major surface of a semiconductor body (10) of opposite conductivity type so as to form p-n junctions therein and a structure for making electrical contact to portions of the circuit comprising an insulating layer (23) formed over the circuit and including windows (24 and 25) formed therein exposing the portions to be contacted, a layer (26) of polycrystalline silicon selectively formed over said insulating layer so as to form a continuous coating over the side walls of said windows, and a layer of metal (28 and 29) formed over said polycrystalline silicon layer CHARACTERIZED IN THAT the junction depths of the source and drain regions are 0.40 μm or less, the side walls of the windows are essentially vertical with sharp edges, and the layer of metal is discontinuous at the side walls so that current conduction is provided by the polycrystalline silicon layer in the areas of the side walls.

8. An MOS integrated circuit including source and drain regions (20 and 21, respectively) of one conductivity type formed in one major surface of a semiconductor body of opposite conductivity type (10) so as to form p-n junctions therein and further including a structure for making electrical contact to portions of the circuit including said source and drain regions comprising a phosphosilicate glass layer (23) formed over the circuit and including windows (24 and 25) formed therein exposing the portions to be contacted, a layer (26) of polycrystalline silicon selectively formed over said insulating layer so as to form a continuous coating over the side walls of said windows and over the exposed portions, and a layer of metal (28 and 29) comprising aluminum formed over said polycrystalline layer CHARACTERIZED IN THAT the junction depths of the source and drain regions are 0.40 μm or less, the side walls of the windows are essentially vertical with sharp edges, the layer of metal is discontinuous at the side walls, and the polycrystalline silicon layer is formed with a thickness of 0.10 μm–1.0 μm and a resistivity of 50Ω/ or less so that current conduction is provided by the polycrystalline silicon layer in the areas of the side walls.

9. The circuit according to claims 1, 7 or 8 wherein the resistance provided by the polycrystalline silicon layer in the areas of the side walls is less than one-half of the source to drain sheet resistance of the MOS device being contacted.

10. The circuit according to claims 1, 7 or 8 wherein the thickness of the insulating layer is within the range 0.50 to 2.0 microns.

* * * * *